(12) United States Patent
How et al.

(10) Patent No.: US 11,328,984 B2
(45) Date of Patent: May 10, 2022

(54) MULTI-DIE INTEGRATED CIRCUIT PACKAGES AND METHODS OF MANUFACTURING THE SAME

(71) Applicant: TEXAS INSTRUMENTS INCORPORATED, Dallas, TX (US)

(72) Inventors: You Chye How, Melaka (MY); Huay Yann Tay, Melaka (MY); Franklin Santos Marcelino, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/858,948

(22) Filed: Dec. 29, 2017

(65) Prior Publication Data
US 2019/0206772 A1 Jul. 4, 2019

(51) Int. Cl.
*H01L 23/495* (2006.01)
*H01L 23/498* (2006.01)
*H01L 23/31* (2006.01)
*H01L 23/00* (2006.01)
(Continued)

(52) U.S. Cl.
CPC .... *H01L 23/49575* (2013.01); *H01L 21/4839* (2013.01); *H01L 21/4842* (2013.01); *H01L 21/56* (2013.01); *H01L 21/561* (2013.01); *H01L 23/3121* (2013.01); *H01L 23/3135* (2013.01); *H01L 23/4951* (2013.01); *H01L 23/49503* (2013.01); *H01L 23/49513* (2013.01); *H01L 23/49537* (2013.01); *H01L 23/49551* (2013.01); *H01L 23/49582* (2013.01); *H01L 23/49805* (2013.01); *H01L 24/48* (2013.01); *H01L 24/49* (2013.01); *H01L 24/73* (2013.01); *H01L 25/50* (2013.01);
*H01L 23/49548* (2013.01); *H01L 2224/16245* (2013.01); *H01L 2224/32141* (2013.01); *H01L 2224/32245* (2013.01); *H01L 2224/32257* (2013.01); *H01L 2224/48091* (2013.01); *H01L 2224/48177* (2013.01); *H01L 2224/48247* (2013.01); *H01L 2224/49052* (2013.01); *H01L 2224/49109* (2013.01);
(Continued)

(58) Field of Classification Search
CPC ........ H01L 23/49551; H01L 23/49575; H01L 24/32; H01L 24/73; H01L 24/91; H01L 25/03; H01L 25/0657; H01L 29/0657; H01L 23/4951; H01L 23/49805; H01L 23/3135; H01L 23/3121; H01L 24/49; H01L 23/49513; H01L 21/4839; H01L 21/56; H01L 23/49537; H01L 23/3107; H01L 23/3114
See application file for complete search history.

(56) References Cited

U.S. PATENT DOCUMENTS 5,719,436 A * 2/1998 Kuhn ...................... H01L 24/49
257/676
6,337,510 B1 1/2002 Chun-Jen et al.
(Continued)

*Primary Examiner* — Thanh Y. Tran
(74) *Attorney, Agent, or Firm* — Dawn Jos; Charles A. Brill; Frank D. Cimino

(57) ABSTRACT

Multi-die integrated circuit packages and methods of manufacturing the same are disclosed. An example integrated circuit package includes a first leadframe, a first die on a first side of the first leadframe, and a second die on a second side of the first leadframe opposite the first side. The example integrated circuit package further includes external second leadframe separate from the first leadframe.

16 Claims, 14 Drawing Sheets

(51) Int. Cl.
*H01L 21/48* (2006.01)
*H01L 21/56* (2006.01)
*H01L 25/00* (2006.01)

(52) U.S. Cl.
CPC .............. *H01L 2224/73265* (2013.01); *H01L 2924/00014* (2013.01)

(56) References Cited

U.S. PATENT DOCUMENTS

| | | |
|---|---|---|
| 6,879,028 B2 | 4/2005 | Gerber et al. |
| 6,927,497 B2 | 8/2005 | Meyers |
| 7,215,022 B2 | 5/2007 | Chan et al. |
| 8,164,199 B2 | 4/2012 | Bhalla et al. |
| 8,288,847 B2 | 10/2012 | Huang et al. |
| 2002/0113304 A1 | 8/2002 | Doh et al. |
| 2006/0151889 A1* | 7/2006 | Kajiwara ................ H01L 24/06 257/787 |
| 2008/0211068 A1* | 9/2008 | Chen ................... H01L 23/3107 257/666 |
| 2009/0001563 A1* | 1/2009 | Bathan ................ H01L 23/3135 257/723 |
| 2010/0025830 A1* | 2/2010 | Camacho ................ H01L 24/49 257/677 |
| 2011/0201159 A1* | 8/2011 | Mori ................. H01L 23/49582 438/123 |
| 2012/0193772 A1 | 8/2012 | Jiang |
| 2012/0326302 A1* | 12/2012 | Camacho ............. H01L 21/568 257/737 |
| 2013/0020690 A1* | 1/2013 | Qiu ........................ H01L 24/06 257/676 |

* cited by examiner

MULTI-DIE INTEGRATED CIRCUIT PACKAGES AND METHODS OF MANUFACTURING THE SAME

FIELD OF THE DISCLOSURE

This disclosure relates generally to integrated circuit packaging, and, more particularly, to multi-die integrated circuit packages and methods of manufacturing the same.

BACKGROUND

Integrated circuit (IC) packaging involves the encapsulation or sealing of semiconductor devices within a housing that includes electrical contacts to connect the devices with other electrical components (e.g., a printed circuit board (PCB)). As technology has advanced, more complex arrangements of multiple ICs, sometimes integrated with passive components, have been incorporated into a single package (e.g., a system in package (SIP), a multi-chip module (MCM), etc.).

SUMMARY

An example integrated circuit package includes a first leadframe, a first die on a first side of the first leadframe, and a second die on a second side of the first leadframe opposite the first side. The example integrated circuit package further includes external second leadframe separate from the first leadframe.

An example integrated circuit package includes a first die, a second die, and a leadframe positioned between the first and second dies. The first and second dies are electrically connected to the leadframe. The leadframe is covered so that no portion of the leadframe is exposed to an external environment.

An example method of manufacturing an integrated circuit package includes attaching a first die to a leadframe. The example method further includes covering the first die to form a leadframe package. The example method also includes attaching a second die to a surface of the leadframe package. The leadframe is to be positioned between the first and second dies. The example method further includes covering the second die.

Figure 1:
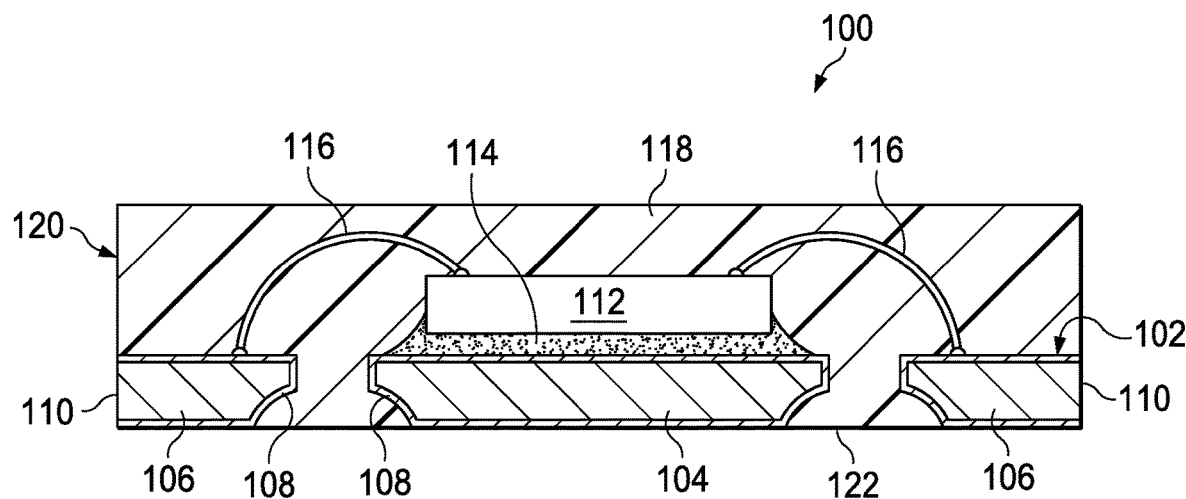
FIG. 1 illustrates a cross-sectional view of an example internal leadframe package constructed in accordance with the teachings disclosed herein.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this disclosure, stating that any part (e.g., a layer, area, or plate) is in any way positioned on (e.g., positioned on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

There is an increased demand for integrating multiple semiconductor dies into a single IC package. One solution has been to mount separate dies on different regions of a leadframe in a side-by-side arrangement. However, this approach results in an increase to the overall footprint of the resulting package. Another solution, that avoids an increase in footprint, is to stack the separate dies with a first die mounted on the leadframe and the second die mounted on the first die.

Both of the above approaches to integrating multiple dies into a single package involve positioning the dies on the same side of the leadframe. Examples disclosed herein involve positioning separate dies on either side of a leadframe. Separate dies have not been mounted on both sides of a leadframe in the past because of the difficulty in connecting wire bonds between the dies and both sides of the leadframe. Furthermore, having a die on both sides of a leadframe presents particular challenges in manufacturing flat no-leads packages such as quad-flat no-leads (QFN) packages and dual-flat no-leads (DFN) packages. Flat no-leads packages are structured with the leads of the leadframe on the bottom surface of the IC package. As such, to place a die on the bottom side of a leadframe would place the die below the leads of the leadframe, thereby preventing the leads from being exposed at a bottom surface as is done for flat no-leads packages. As disclosed herein, these challenges are overcome by attaching dies on either side of an internal leadframe that is separate from an external leadframe that is positioned with leads that are exposed on the bottom surface of the final IC package.

FIGS. 1-4 illustrate cross-sectional views of example internal leadframe packages 100, 200, 300, 400. As shown in the illustrated example, each of the internal leadframe packages 100, 200, 300, 400 includes a corresponding internal leadframe 102, 202, 302, 402. While the leadframes 102, 202, 302, 402 are shown at the bottom of the respective packages 100, 200, 300, 400 in the illustrated examples, the leadframes 102, 202, 302, 402 are referred to as "internal" leadframes because the leadframes will be positioned within an internal region of final multi-die packages as discussed further below.

In the illustrated example of FIG. 1, the internal leadframe 102 includes a full die attach pad 104 that is spaced apart from separate leads 106. In some examples, the internal leadframe 102 is made of copper with a plating metal 108 applied to the exterior surface of the leadframe 102. In some examples, the plating metal 108 includes tin (Sn), nickel (Ni), palladium (Pd), gold (Au), and/or combinations thereof (e.g., NiPd, NiPdAu). The distal ends 110 of the leads 106 in the illustrated example do not include the plating metal 108 because the leadframe 102 was singulated or cut at that point to separate the internal leadframe package 100 from other packages formed during the same packaging processes. As shown in the illustrated example, the internal leadframe package 100 includes a die 112 attached to the die attach pad 104 via a die attach layer 114. The die attach layer 114 is any suitable material used to attach the die 112 to the die attach pad 104. Further, the die 112 is electrically connected to the leads of the internal leadframe 102 via wire bonds 116 using any suitable technique. Once the die 112 is mounted to the die attach pad 104 and electrically coupled to the leads 106, the entire assembly is covered within a molding compound 118 using an encapsulation process. Once cured, the molding compound 118 serves as a casing 120 for the internal leadframe package 100.

Figure 2:
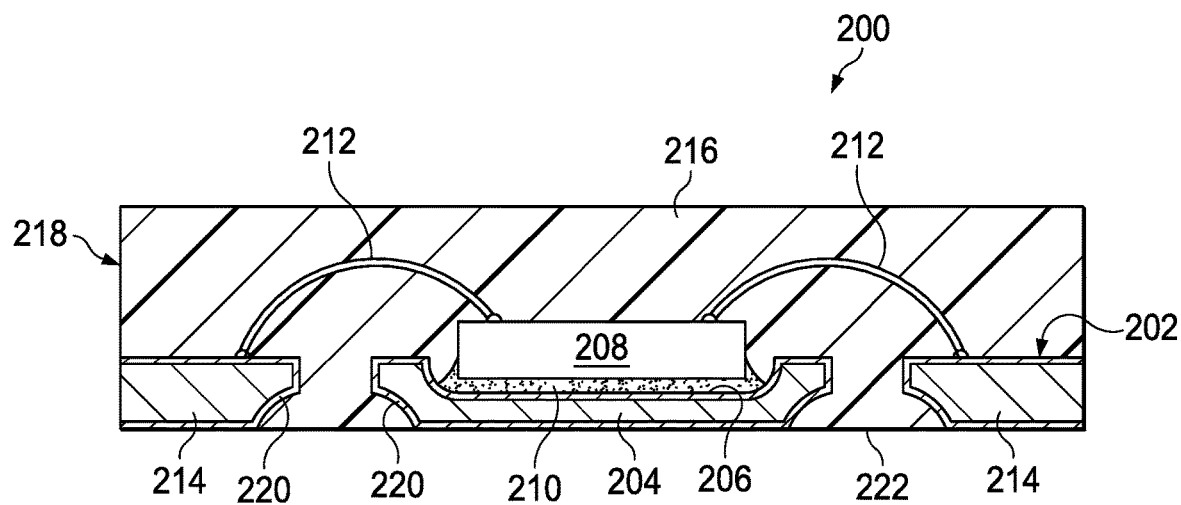
FIG. 2 illustrates a cross-sectional view of another example internal leadframe package constructed in accordance with the teachings disclosed herein.

The example internal leadframe package 200 of FIG. 2 is similar to the internal leadframe package 100 of FIG. 1 except for the designs of the internal leadframes 102, 202. In particular, the internal leadframe 202 of FIG. 2 includes a half-etched die attach pad 204 whereas the die attach pad 104 of FIG. 1 is a full die attach pad. That is, as shown in FIG. 2, the die attach pad 204 includes a recessed region 206 onto which a die 208 is mounted via a die attach layer 210. Further, as shown in the illustrated example, wire bonds 212 electrically connect the die 208 to leads 214 of the internal leadframe 202 using any suitable wire bonding technique. Once the die 208 is mounted to the die attach pad 204 and electrically coupled to the leads 214, the entire assembly is covered within a molding compound 216 using an encapsulation process. Once cured, the molding compound 216 serves as a casing 218 for the internal leadframe package 100. In the illustrated example of FIG. 2, the internal leadframe 202 is coated with a plating metal 220 that is comparable to the plating metal 108 of FIG. 1.

Figure 3:
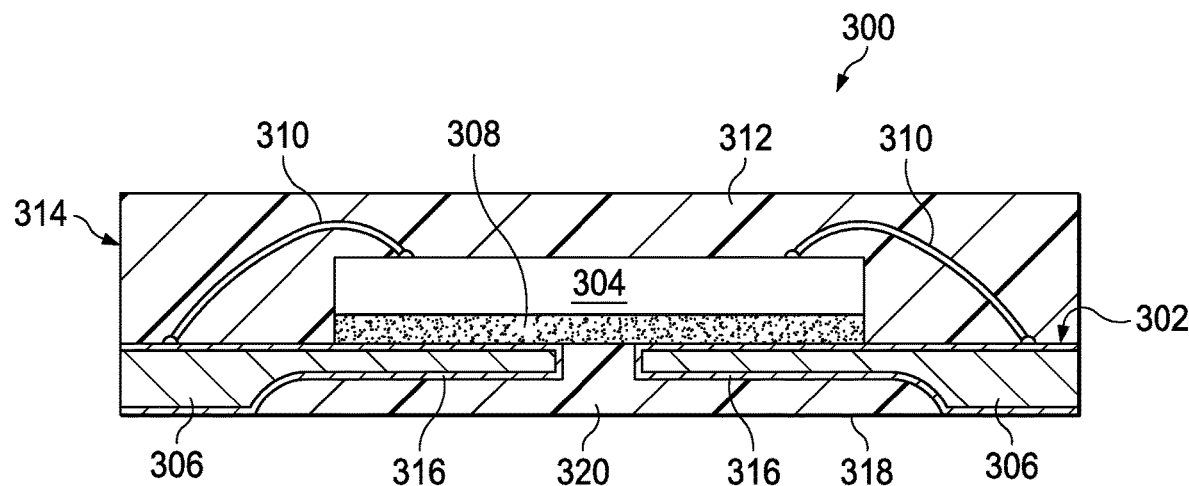
FIG. 3 illustrates a cross-sectional view of another example internal leadframe package constructed in accordance with the teachings disclosed herein.

The example internal leadframe package 300 of FIG. 3 illustrates a chip-on-lead design configuration. As shown in the illustrated example of FIG. 3, a die 304 is mounted directly to portions of leads 306 of the internal leadframe 302 without a separate die attach pad. The die 304 is mounted to the leads 306 via any suitable die attach layer 308. Further, as shown in the illustrated example, wire bonds 310 electrically connect the die 304 to the leads 306 using any suitable wire bonding technique. Once the die 304 is attached and electrically connected to the leads 306, the entire assembly is covered within a molding compound 312 using any suitable encapsulation process. Once cured, the molding compound 312 serves as a casing 314 for the internal leadframe package 100. In the illustrated example of FIG. 3, the internal leadframe 302 is coated with a plating metal 316 that is comparable to the plating metal 108 of FIG. 1.

Figure 4:
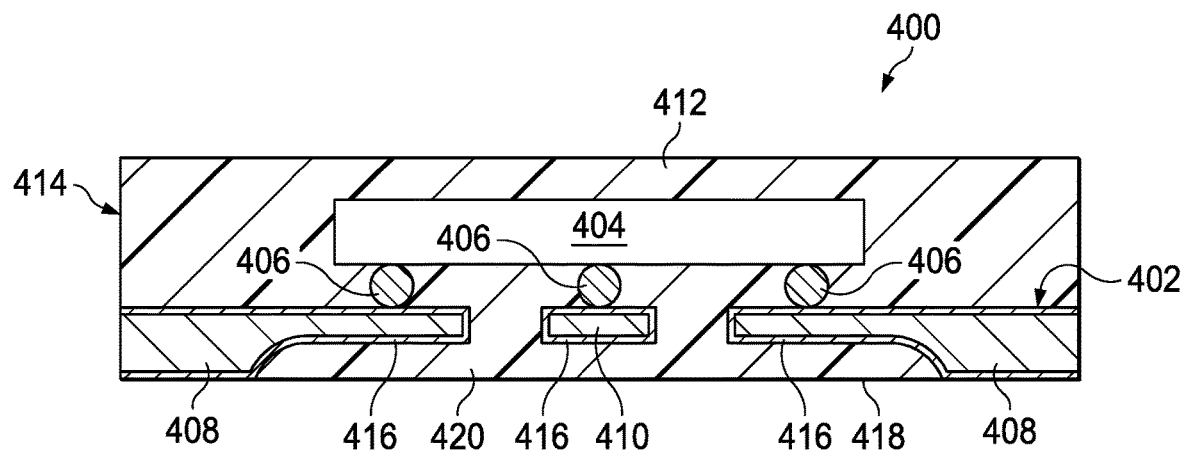
FIG. 4 illustrates a cross-sectional view of another example internal leadframe package constructed in accordance with the teachings disclosed herein.

The example internal leadframe package 400 of FIG. 4 illustrates a flip chip design configuration. As shown in the illustrated example of FIG. 4, a die 404 includes a plurality of solder bumps 406 that are used to mount the die to the internal leadframe 402. As shown in the illustrated example, at least some of the solder bumps 406 directly connect with leads 408 of the leadframe. Other ones of the solder bumps 406 connect to central lands 410 that are isolated from the leads 408. The solder bumps 406 provide the means to adhere or attach the die 404 to the internal leadframe 402 and also provide the means to electrically connect the die to the leads 408 of the internal leadframe. Thus, there is no need for wire bonding in the illustrated example of FIG. 4. Once the die 404 is attached and electrically connected to the internal leadframe 402, the entire assembly is covered within a molding compound 412 using any suitable encapsulation process. Once cured, the molding compound 412 serves as a casing 414 for the internal leadframe package 100. In the illustrated example of FIG. 4, the internal leadframe 402 is coated with a plating metal 416 that is comparable to the plating metal 108 of FIG. 1.

Each of the internal leadframe packages 100, 200, 300, 400 of FIGS. 1-4 has a QFN structure in which the leads 106, 214, 306, 408 do not protrude beyond the exterior perimeter of the housing for each package as defined by the respective molding compound 118, 216, 312, 412. However, the leads 106, 214, 306, 408 in each of the illustrated examples are exposed at a bottom surface 122, 222, 318, 418 of the respective internal leadframe package 100, 200, 300, 400. The leads on a QFN structure are typically exposed at the bottom surface to enable mounting (using solder) to a PCB. However, as will be described further below, the leads 106, 214, 306, 408 in the illustrated examples are exposed to electrically connect a second die on the opposite side of the internal leadframes 102, 202, 302, 402.

As shown in the illustrated examples of FIGS. 1 and 2, the die attach pads 104, 204 of the internal leadframes 102, 202 are also exposed at the bottom surface of the respective internal leadframe packages 100, 200. By contrast, as shown in the illustrated examples of FIGS. 3 and 4, the portions of the leadframes 302, 402 onto which the respective dies 304, 404 are attached are separated from the bottom surface 318, 418 by respective isolation regions 320, 420 that have been filled with the molding compound 312, 412. In some examples, the layer of the molding compound 312, 412 in the isolation regions 320, 420 serve to isolate the second dies 304, 404 from the internal leadframes 302, 402 of the respective internal leadframe packages 300, 400.

Figure 5:
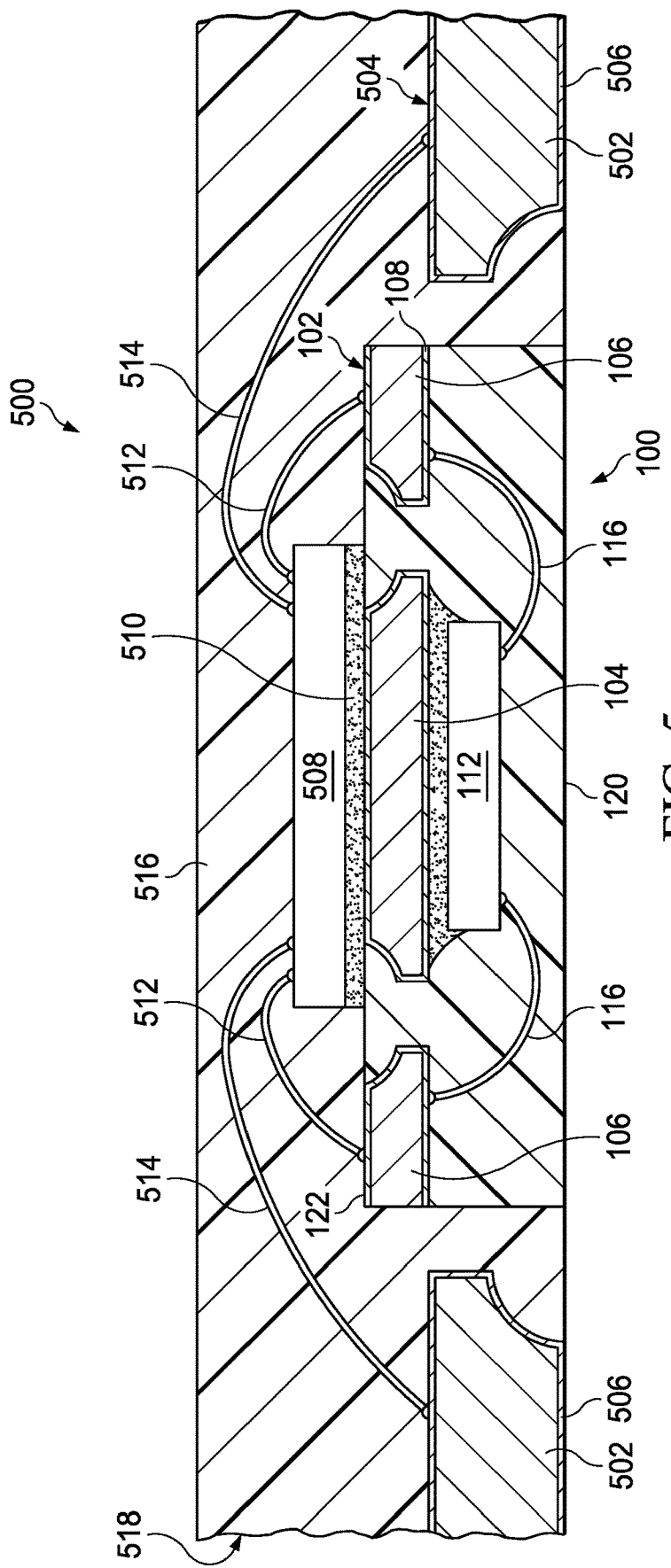
FIG. 5 illustrates a cross-sectional view of an example multi-die package that includes the example internal leadframe package of FIG. 1.

FIG. 5 illustrates a cross-sectional view of an example multi-die package 500 that includes the example internal leadframe package 100 of FIG. 1. As shown in the illustrated example, the internal leadframe package 100 has been flipped upside down relative to its orientation shown in FIG. 1. Thus, as shown in FIG. 5, the bottom surface 122 of the internal leadframe package 100 is facing upwards with the internal leadframe 102 positioned at the top and the die 112 positioned underneath. Furthermore, the internal leadframe package 100 is positioned between leads 502 of an external leadframe 504. As used herein, an "external" leadframe refers to the leadframe of a multi-die package (e.g., the multi-die package 500 of FIG. 5) with portions (e.g., the leads 502) that are exposed to an external environment. By contrast, as shown in the illustrated example, an "internal" leadframe is disposed entirely internally within the multi-die package such that no portion of the internal leadframe is exposed to the external environment. In some examples, the external leadframe 504 (and the associated leads 502) have a thickness that is greater than the internal leadframe 102. In other examples, the external leadframe 504 and the internal leadframe 102 have the same thickness. In other examples, the internal leadframe 102 have a thickness that is greater than the external leadframe 504. In the illustrated example of FIG. 5, the external leadframe 504 is coated with a plating metal 506 that is comparable to the plating metal 108 on the internal leadframe 102.

As shown in the illustrated example, a second die 508 is mounted (via a die attach layer 510) to the bottom surface 122 of the internal leadframe package 100. In this arrangement, the two dies 112, 508 are positioned on either side of the internal leadframe 102. More particularly, in the illustrated example of FIG. 5, both of the dies 112, 508 are attached to the opposite sides of the die attach pad 104. In some examples, a first set of wire bonds 512 electrically connect the second die 508 to the leads 106 of the internal leadframe 102. For purposes of clarity, the leads 106 of the internal leadframe 102 are referred to as internal leads while the leads 502 of the external leadframe 504 are referred to as external leads. Wire bonding the second die 508 to the internal leads 106 is possible because, as described above, the internal leadframe package 100 is manufactured with a QFN structure in which the internal leads 106 are exposed at the bottom surface 122 of the internal leadframe package 100. One reason for the plating metal 108 surrounding the exterior surface of the internal leadframe 102 is to facilitate and/or improve the connection of the wire bonds 512.

In addition to the first set of wire bonds 512 electrically connecting the second die 508 to the internal leads 106, a second set of wire bonds 514 electrically connect the second die 508 to the external leads 502. As shown in FIG. 5, there are no wire bonds directly connecting the first die 112 to the external leadframe 504 because the first die 112 is already covered within the casing 120 of the internal leadframe package 100. In the illustrated example, the first die 112 is electrically connected to the external leads 502 indirectly via the wire bonds 116 within the internal leadframe package 100 that are connected to the internal leads 106, which are, in turn, connected in series to the first and second sets of wire bonds 512, 514. Additionally or alternatively, in some examples, wire bonds extending directly between the internal leads 106 and the external leads 502 are formed to electrical connect the first and/or second dies 112, 508 to the external leads 502.

Once the second die 508 is attached to the bottom surface 122 of the internal leadframe package 100 and the wire bonds 512, 514 have been connected, the entire assembly is covered within a molding compound 516 to define a housing 518 for the final multi-die package 500. As shown in the illustrated example, the molding compound 516 covers the bottom surface 122 and sides of the internal leadframe package 100. As a result, no portion of the internal leadframe is exposed to an external environment of the multi-die package 500. In some examples, the molding compound 516 used for the housing 518 is the same as the molding compound 118 used for the casing 120 of the internal leadframe package 100. In other examples, the molding compounds 118, 516 for each of the casing 120 and the housing 518 are different.

Figure 6:
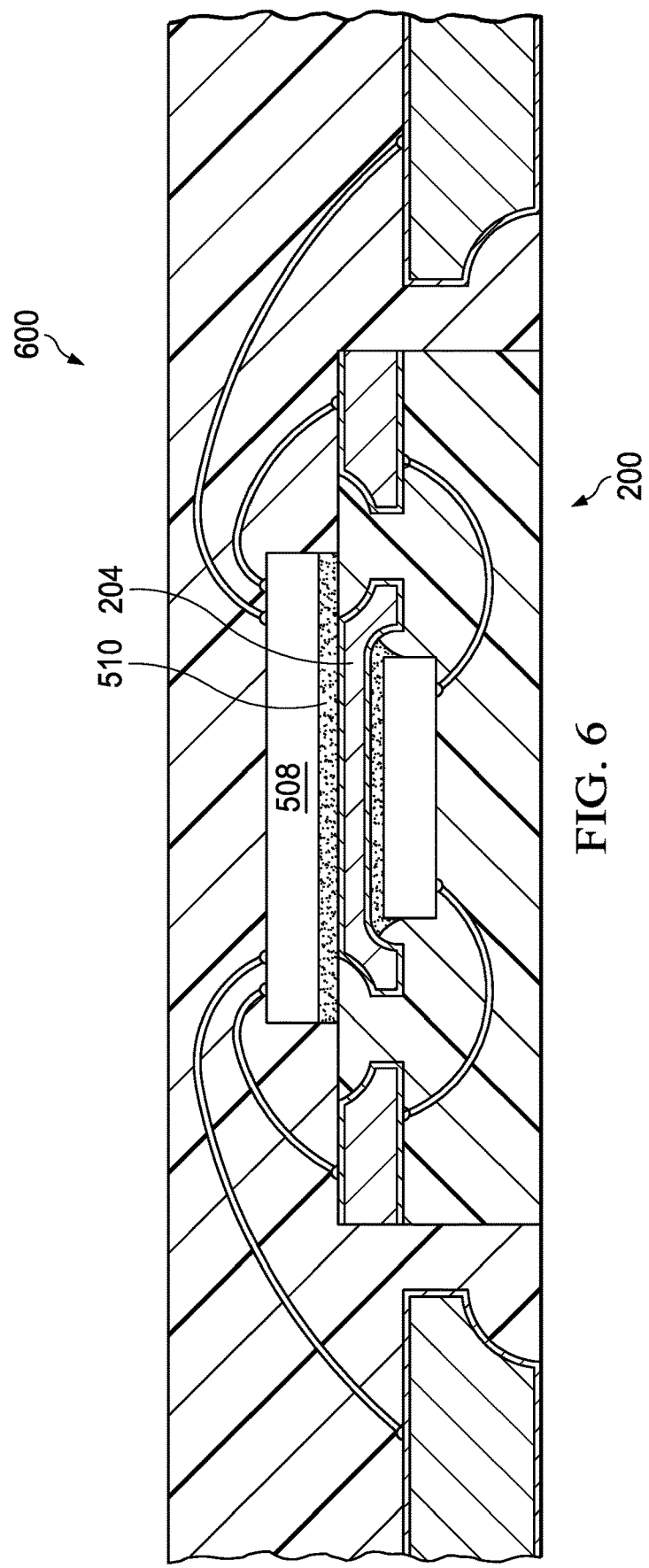
FIG. 6 illustrates a cross-sectional view of another example multi-die package that includes the example internal leadframe package of FIG. 2.
Figure 7:
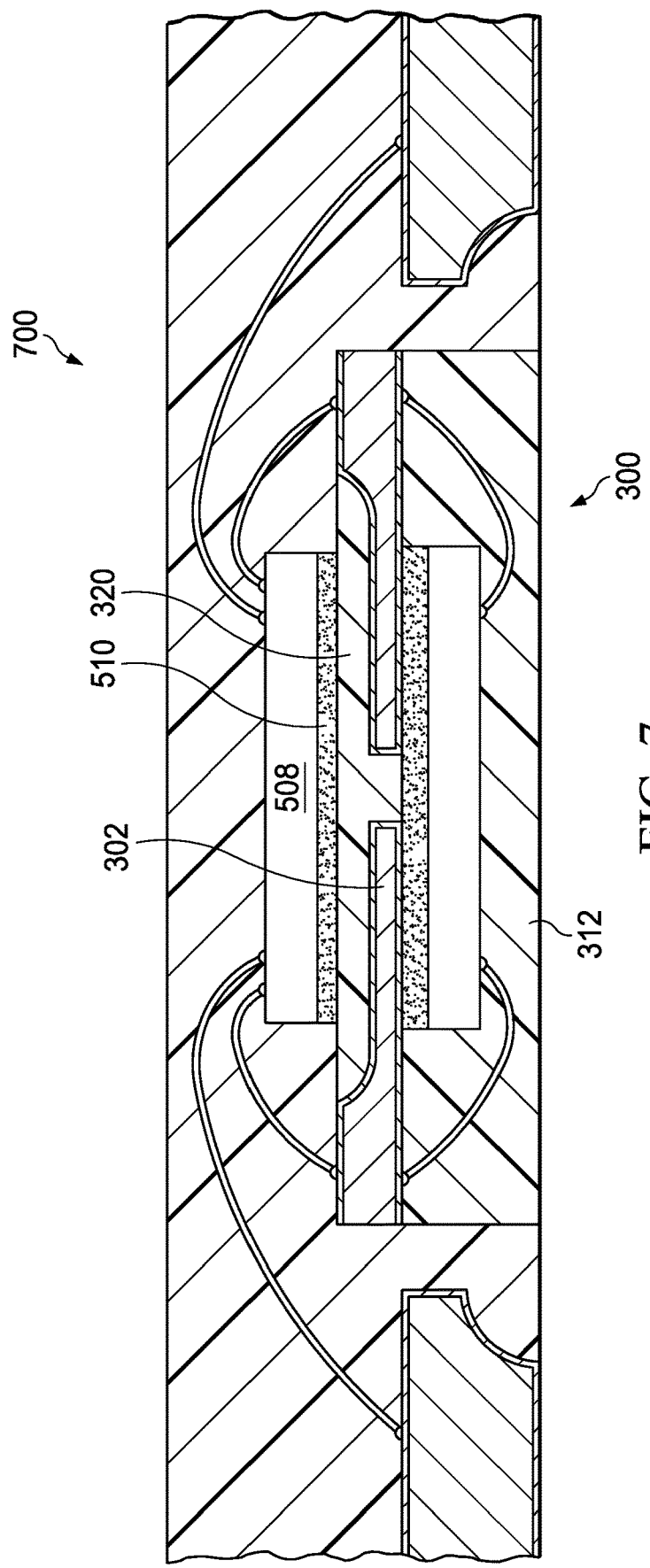
FIG. 7 illustrates a cross-sectional view of another example multi-die package that includes the example internal leadframe package of FIG. 3.
Figure 8:
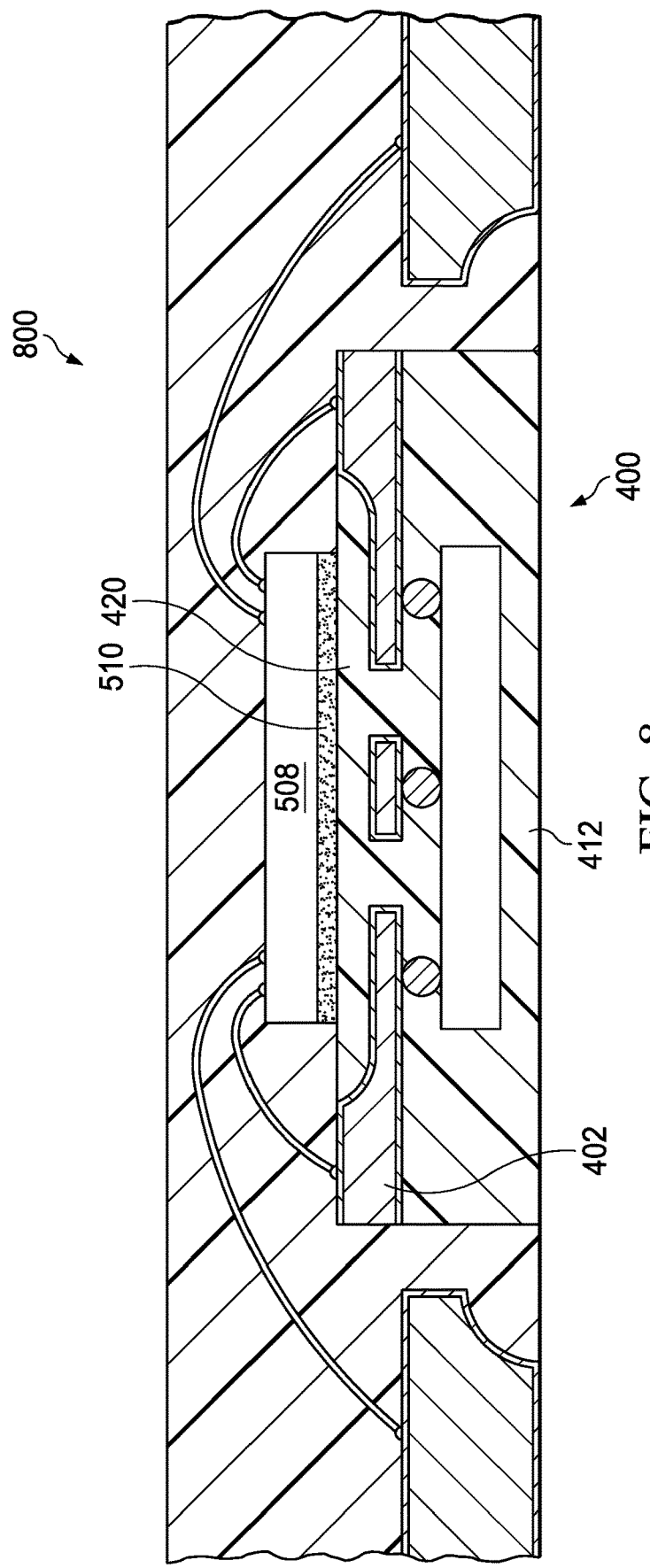
FIG. 8 illustrates a cross-sectional view of another example multi-die package that includes the example internal leadframe package of FIG. 4.

FIG. 6 illustrates a cross-sectional view of another example multi-die package 600 that includes the example internal leadframe package 200 of FIG. 2. FIG. 7 illustrates a cross-sectional view of another example multi-die package 700 that includes the example internal leadframe package 300 of FIG. 3. FIG. 8 illustrates a cross-sectional view of another example multi-die package 800 that includes the example internal leadframe package 400 of FIG. 4. Each of the multi-die packages 600, 700, 800 of FIGS. 6-8 are constructed in a similar manner to the multi-die package 500 of FIG. 5 described above except that each of the multi-die packages 500, 600, 700, 800 include a different one of the internal leadframe packages 100, 200, 300, 400 of FIGS. 1-4.

As shown in the illustrated examples of FIGS. 5 and 6, the second die 508 is attached (via the die attach layer 510) directly to the internal leadframe 102, 202 of the corresponding internal leadframe package 100, 200. By contrast, as shown in the illustrated examples of FIGS. 7 and 8, the second die is not attached or contacting (via the die attach layer 510) the internal leadframe 302, 402 of the corresponding internal leadframe package 100, 200. Rather, the second die 508, shown in FIGS. 7 and 8, is separated or isolated from the corresponding internal leadframe 302, 402 by a layer of the molding compound 312, 412 of the respective internal leadframe packages 300, 400 in the isolation regions 320, 420.

Figure 9:
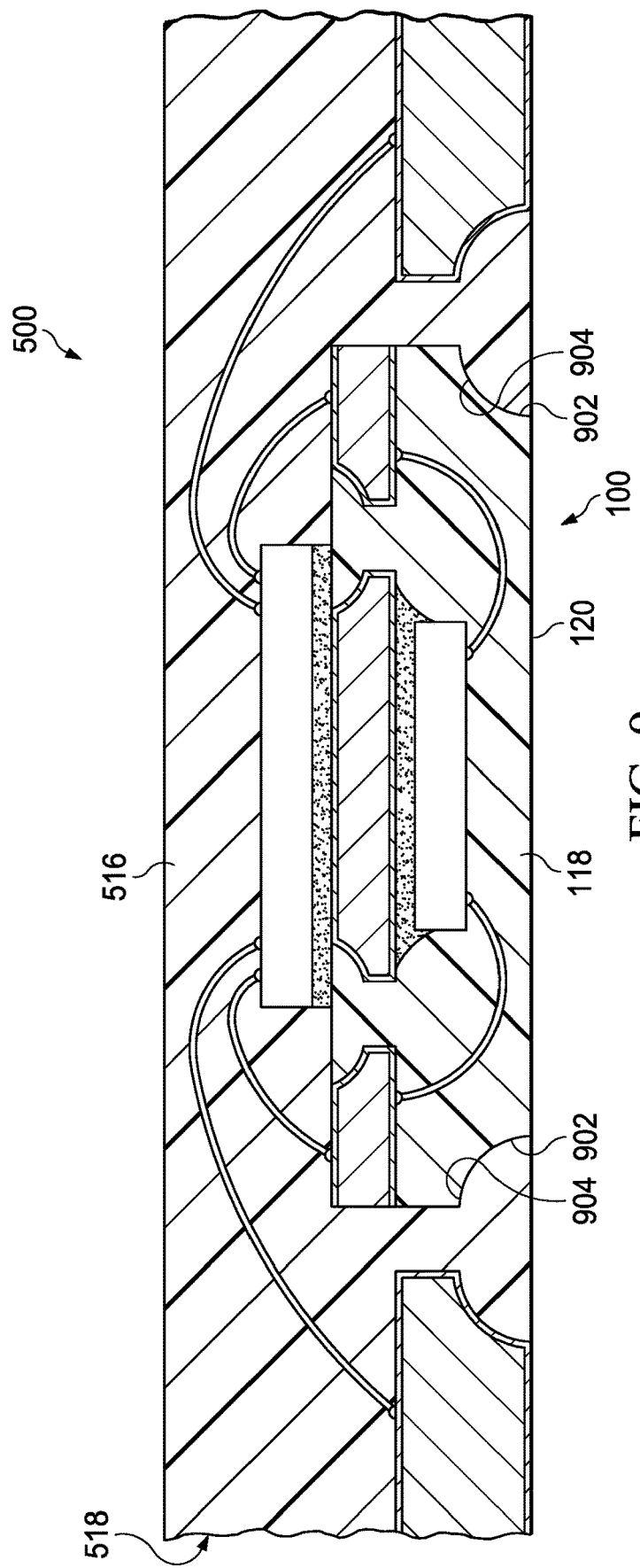
FIG. 9 illustrates a cross-sectional view of a modified form of the example multi-die package of FIG. 5.

FIG. 9 illustrates a cross-sectional view of a modified form of the example multi-die package 500 of FIG. 1. In particular, the multi-die package 500 as shown in FIG. 9 is identical to that shown in FIG. 5 except that the internal leadframe package 100 in FIG. 9 includes notches 902 formed in the casing 120. Similar notches could be included in the casings 218, 314, 414 associated with any one of the other example internal leadframe packages 200, 300, 400 shown in FIGS. 2-4. During the final encapsulation process for the multi-die package 500, the molding compound 516 will flow into the notches 902 of the casing 120 of the internal leadframe package 100. In this manner, a nonlinear or interlocking interface 904 is formed between the molding compound 516 of the outer housing 518 of the multi-die package 500 and the sides of the casing 120 of the internal leadframe package 100. The interlocking interface 904 helps secure the internal leadframe package 100 within the multi-die package 500. Furthermore, the interlocking interface 904 reduces the leakage of moisture up the interface, thereby reducing the risk of corrosion to the components within the multi-die package 500.

While the example multi-die packages 500, 600, 700, 800 of FIGS. 5-9 are shown with only a single internal leadframe package 100, 200, 300, 400, in other examples, more than one internal leadframe package is included within a single external housing of a final multi-die package. While this results in a larger overall size for the multi-die package, it allows for the design and manufacture of packages with more sophisticated and/or complex functionality (e.g., SIPs, MCMs). Furthermore, in some examples, more than one die is positioned on either side of the internal leadframe. For instance, in some examples, separate dies are stacked on either side of the internal leadframe and/or positioned in a side-by-side arrangement to further increase the number of dies within a final multi-die package.

Further still, FIGS. 5-9 illustrate multi-die packages 500, 600, 700, 800 with a QFN-like structure in which the external leads do not protrude beyond the external housing but are exposed on the underside or bottom of the package and along a perimeter of the package. However, the teachings disclosed herein are suitably adapted to manufacture other types of multi-die packages with dies on opposite sides of an internal leadframe. In some examples, internal leadframe packages substantially similar to the internal leadframe packages 100, 200, 300, 400 of FIGS. 1-4 are embedded within molding compounds for housings associated with packages that have leads protruding from the housing. As an example, an internal leadframe package is embedded within a transistor outline (TO) package without significantly increasing the size of the package because such packages have relatively thick housings when compared with some other types of packages. Further, in some examples, internal leadframe packages as disclosed herein are embedded in a thin shrink small outline package (TSSOP) or a plastic dual in-line package (PDIP). In some such examples, the external leadframe (associated with the TSSOP or PDIP) includes a step-down or half-etched die pad to provide greater space within the housing for the internal leadframe package. Additionally or alternatively, in some examples, the internal leadframe package inserted within an external housing is manufactured with thinner dimensions than would be typical if the internal leadframe package were intended to serve as a stand along device to reduce or eliminate an increase in size of the final external housing. That is, in some examples, the thickness of the casing 120, 218, 314, 414 of the internal leadframes 100, 200, 300, 400 is less than typical QFN packages with less molding compound between the wire bonds and the exterior surface of the internal leadframe packages.

Figure 10:
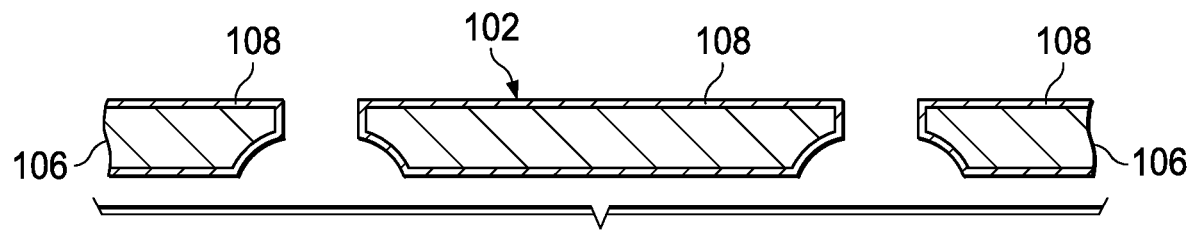
FIGS. 10-22 illustrate example stages in the process of manufacturing the example multi-die package of FIG. 9.

FIGS. 10-22 illustrate example stages in the process of manufacturing the example multi-die package 500 as shown in FIG. 9. Although the illustrated examples of FIGS. 10-22 are described with respect to the multi-die package 500 of FIG. 9, the description provided below adaptable to manufacture any of the multi-die packages 500, 600, 700, 800 disclosed herein. Furthermore, as mentioned above, the description is also adaptable to manufacture any other suitable types of packages (e.g., TO, TSSOP, PDIP, etc.). The manufacturing process begins at FIG. 10 with the fabrication of the internal leadframe 102. In the illustrated example of FIG. 10, the leads 106 of the leadframe 102 are shown to be longer than in FIG. 1 to indicate that the leads 106 are connected to other leads corresponding to other leadframes when initially manufactured. That is, in some examples, the internal leadframe 102 is fabricated on a leadframe strip, which is a piece of metal (e.g., copper) that includes multiple individual leadframes that will be subsequently cut out through a singulation process as described further below. In some examples, the plating metal 108 is applied to the exterior surface of the entire leadframe strip of which the particular internal leadframe 102 is a part.

Figure 11:
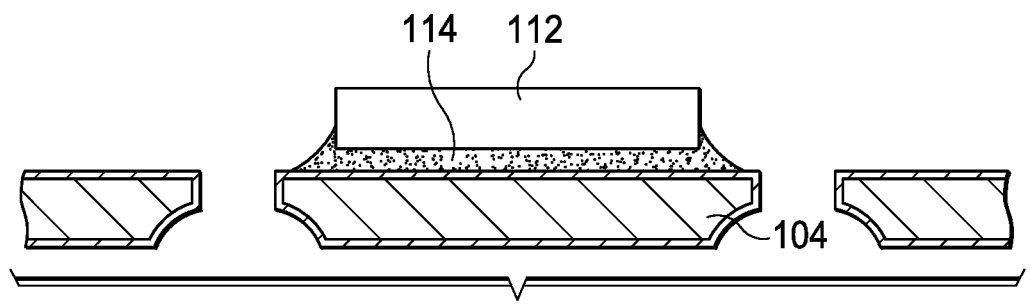
Figure 12:
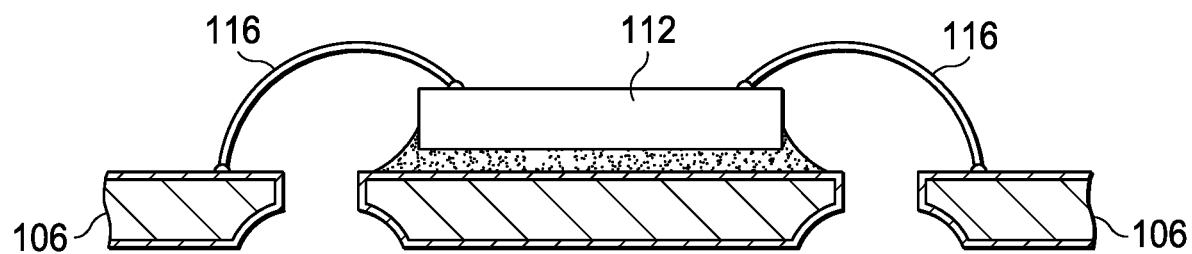
Figure 13:
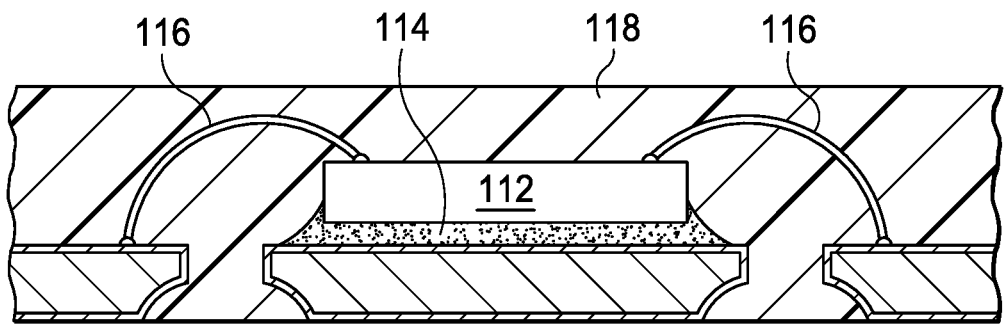
Figure 14:
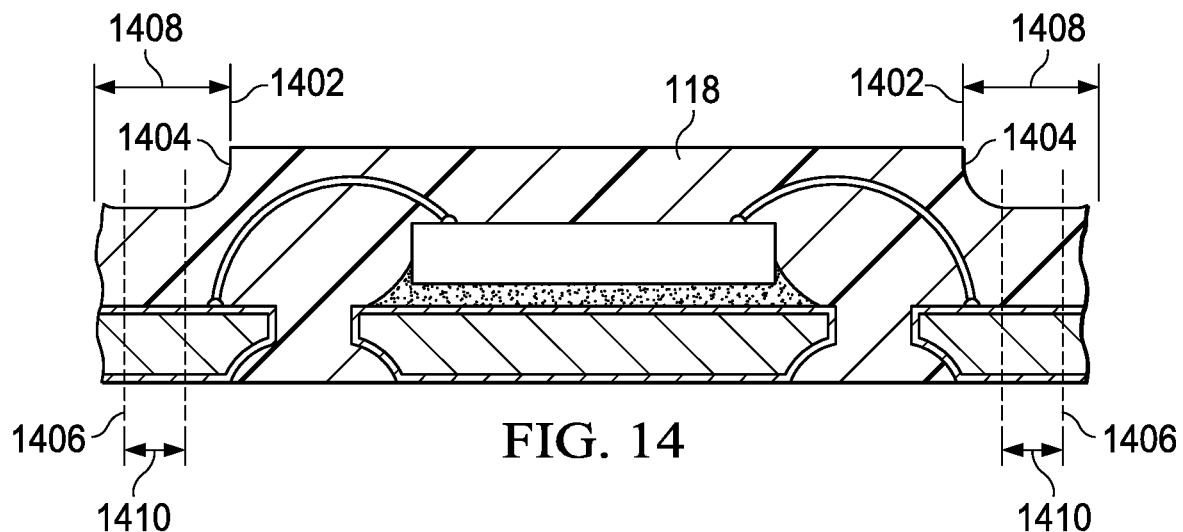
Figure 15:
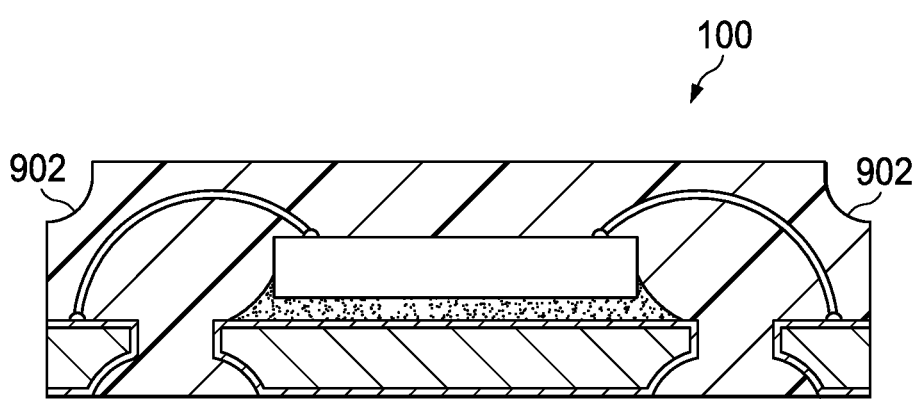

FIG. 11 represents the die 112 being attached to the die attach pad 104 via the die attach layer 114. FIG. 12 represents the connection of the wire bonds 116 between the die 112 to the leads 106. FIG. 13 represents the molding compound 118 being applied to cover the die 112 and the associated wire bonds 116. The molding compound 118, once cured, will serve as the casing 120 for the internal leadframe package 100. FIGS. 14 and 15 represent the formation of the notches 902 in the casing 120 and the singulation of the internal leadframe package 100 from other adjacent packages. In some examples, the notches 902 are fabricated by passing a first singulation saw along first singulation paths 1402 through the cured molding compound 118 at a partial depth to form grooves 1404 as represented in FIG. 14. As shown in the illustrated example, this initial cutting process does not completely singulate the leadframe package 100 from other adjacent packages. Thereafter, a second singulation saw is passed through the entire assembly along second singulation paths 1406 to separate the internal leadframe package 100 from other adjacent packages. In some examples, the first singulation saw has a first width 1408 that is larger than a second width 1410 of the second singulation saw. The different widths 1408, 1410 of the separate singulation saws results in the notches 902 as shown in FIG. 15. To manufacture the internal leadframe package 100 without the notches 902 (as shown in FIG. 1), the partial cutting by the first singulation saw is omitted. A similar process as described in FIGS. 10-15 is followed to manufacture any one of the internal leadframe packages 100, 200, 300, 400 of FIGS. 1-4.

Figure 16:
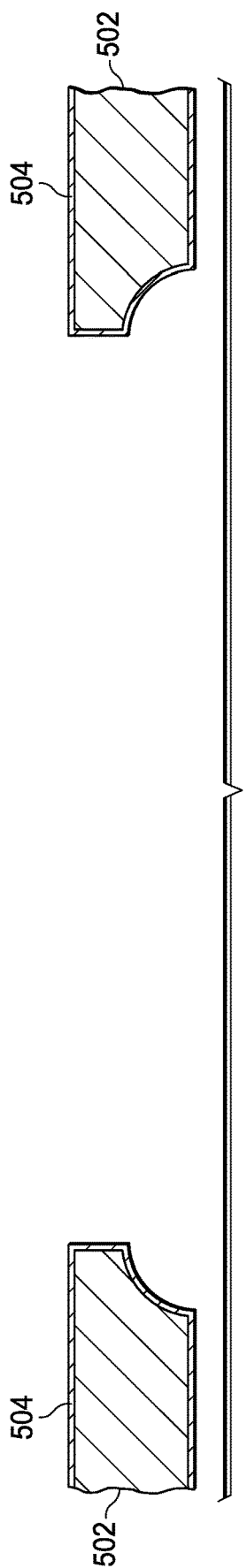

FIGS. 16-22 illustrate the stages of incorporating the internal leadframe package 100 of FIG. 15 into the multi-die package 500 as shown in FIG. 9. FIG. 16 represents the fabrication of the external leadframe 504. Although FIG. 16 is described as following FIG. 15, the external leadframe 504 may be fabricated before, during, or after any of the stages represented in FIGS. 10-15. In some examples, the external leadframe 504 is part of a leadframe strip that includes other leadframes integrated therewith. Thus, in the illustrated example of FIG. 16, the leads 502 of the external leadframe 504 are shown to be longer than in FIG. 9 to indicate that the external leads 502 are connected to other leads corresponding to other leadframes. In some examples, the plating metal 506 is applied to the exterior surface of the entire leadframe strip of which the particular external leadframe 504 is a part.

Figure 17:
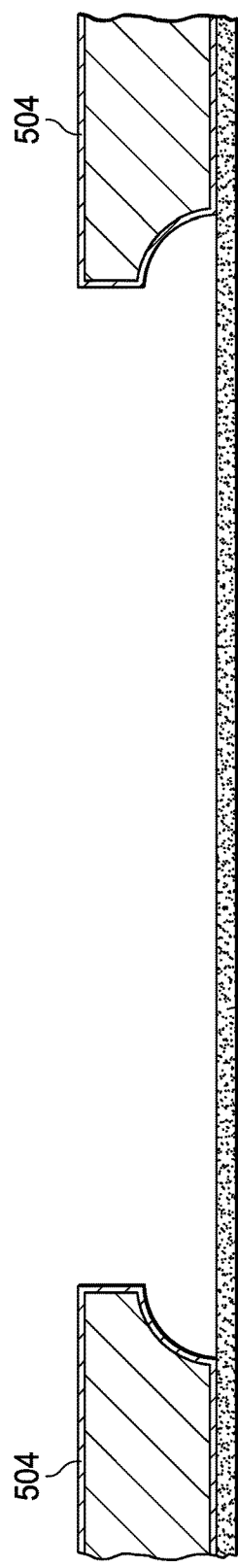
Figure 18:
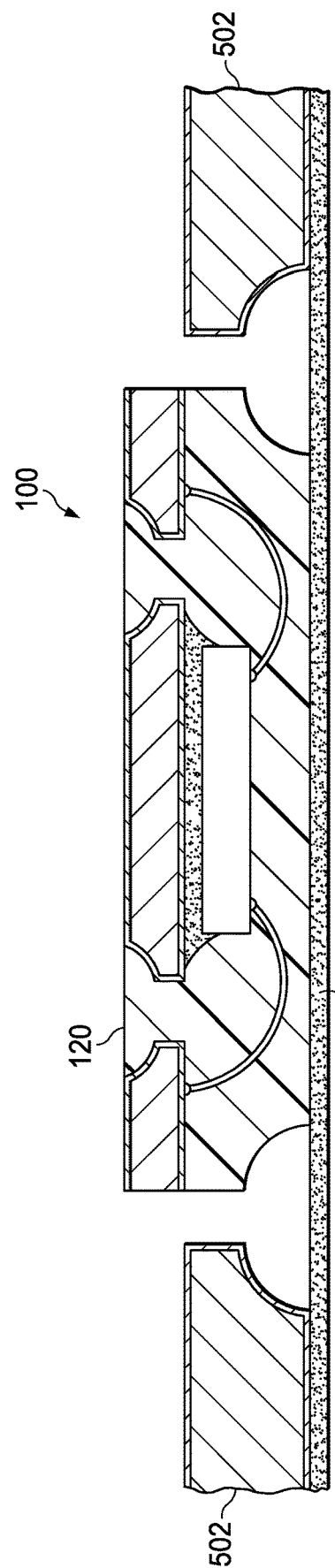

FIG. 17 represents the application of laminate tape 1700 to the underside of the external leadframe 504. As shown in FIG. 17, the underside of the leadframe 504 corresponds to the bottom side of the final multi-die package 500 that is mounted (e.g., soldered) to a PCB. FIG. 18 represents attaching the internal leadframe package 100 to the laminate tape 1700 positioned between the external leads 502. As shown in the illustrated example, the internal leadframe package 100 is flipped over so that the bottom surface 122 of the package 100 is facing upwards.

Figure 19:
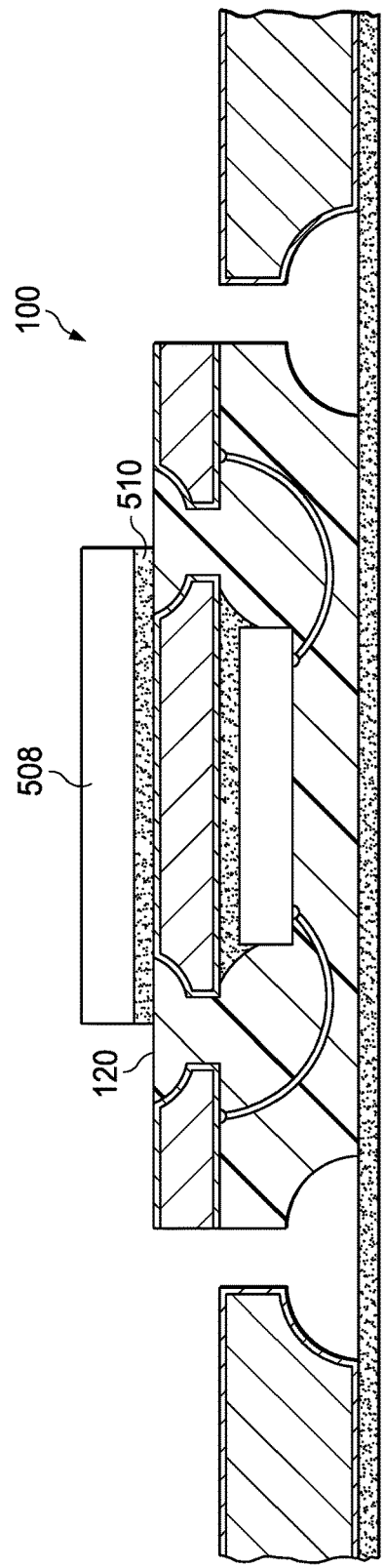
Figure 20:
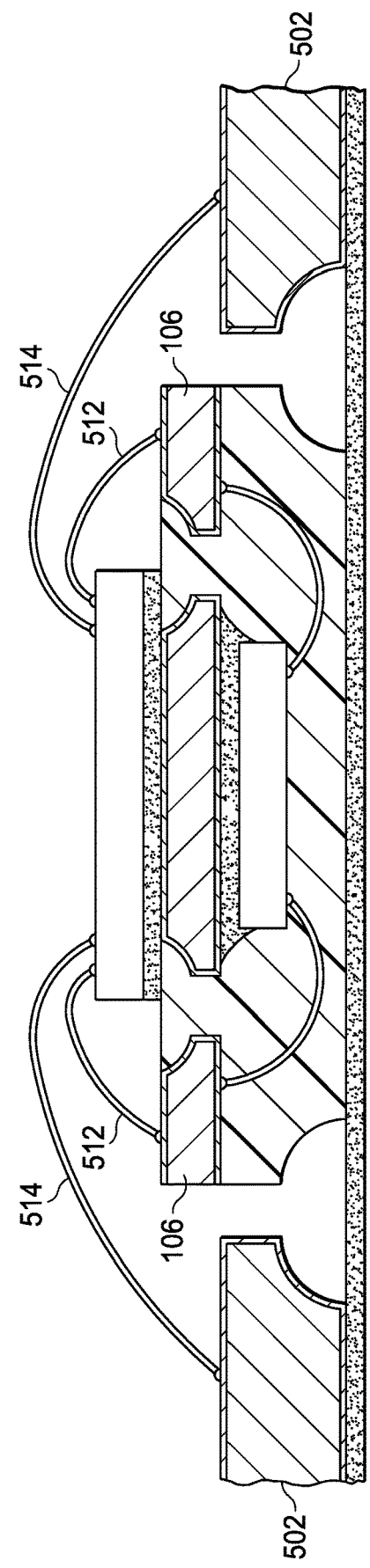
Figure 21:
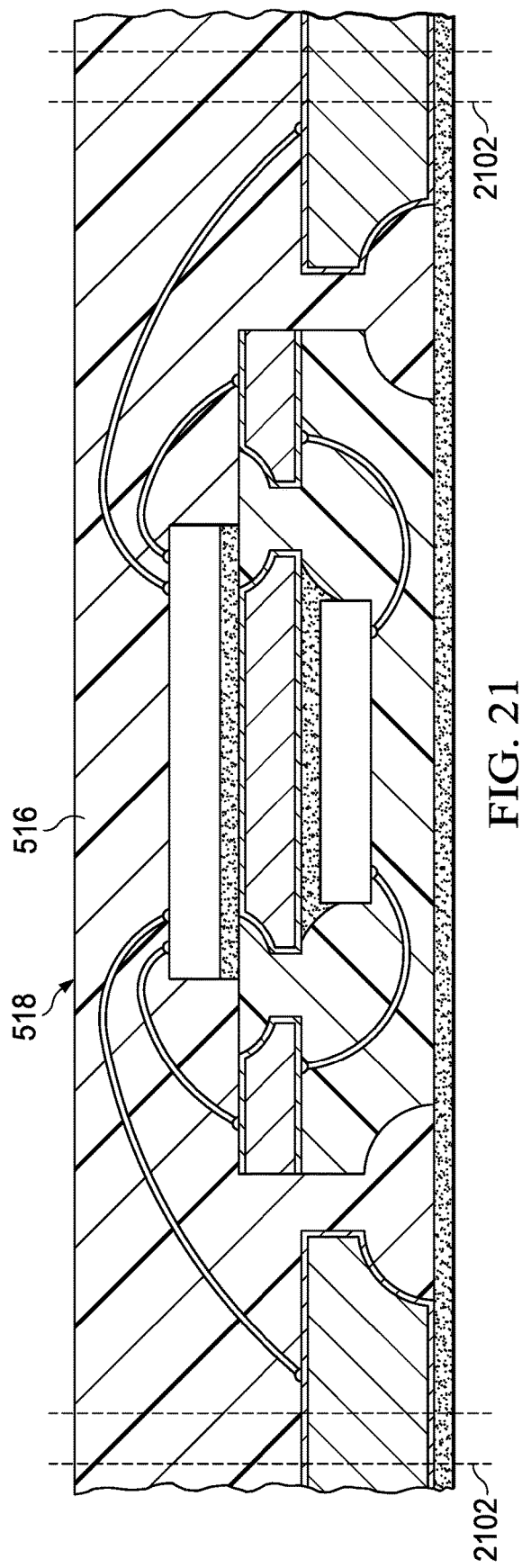
Figure 22:
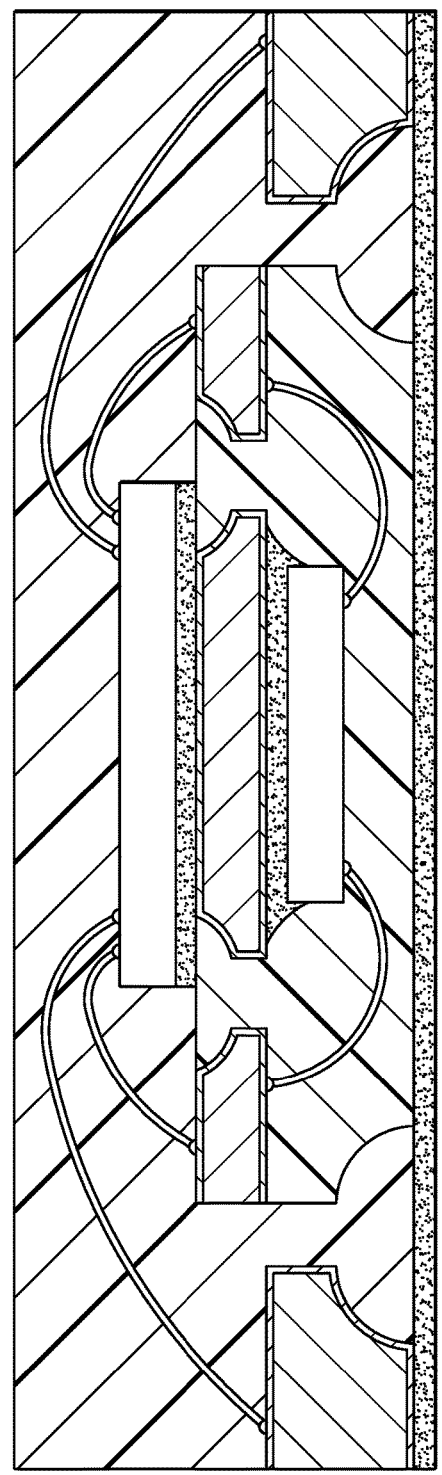

FIG. 19 represents the second die 508 being attached to the bottom surface 122 of the internal leadframe package 100 via the die attach layer 510. FIG. 20 represents the connection of the different sets of wire bonds 512, 514 between the second die 508 and the internal leads 106 and/or the external leads 502. FIG. 21 represents the molding compound 516 being applied to cover the entire assembly and form the outer housing 518. After the encapsulation process, the laminate tape 1700 is removed. FIG. 21 also shows example singulation paths 2102 followed by a singulation saw to separate the final multi-die package 500 from other packages. The final multi-die package 500 is shown in FIG. 22, which is identical to that shown in FIG. 9.

Figure 23:
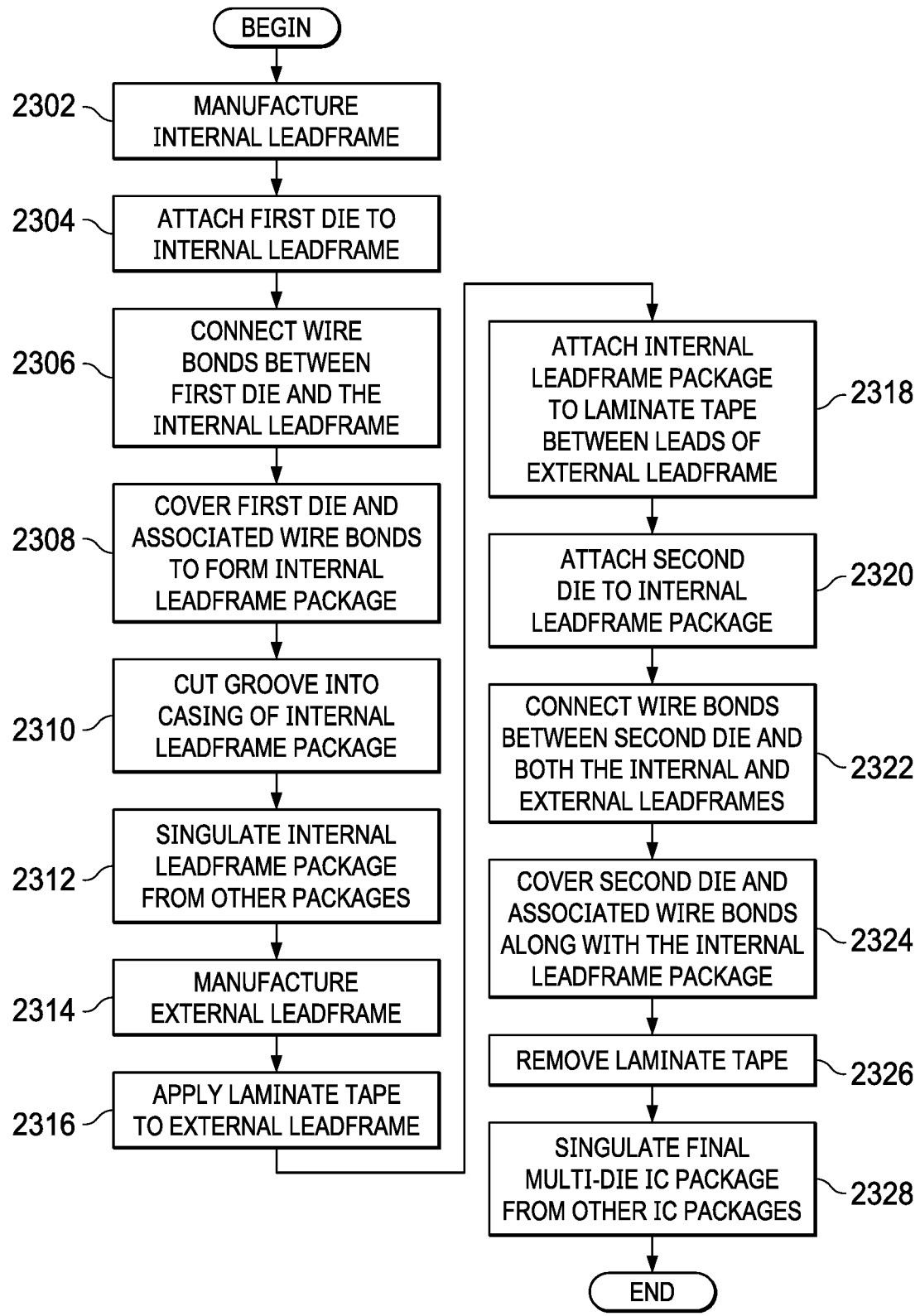
FIG. 23 is a flowchart representative of an example method to manufacture the example multi-die packages of FIGS. 5-9.

FIG. 23 is a flowchart representative of an example method to manufacture the example multi-die packages 500, 600, 700, 800 of FIGS. 5-9. The example method is adapted to manufacture any other suitable types of multi-die packages (e.g., TO, TSSOP, PDIP, etc.). The example process begins at block 2302 by manufacturing an internal leadframe (e.g., the internal leadframes 102, 20, 302, 402). In some examples, the internal leadframe is made of copper and is plated with a plating metal (e.g., the plating metal 108, 220, 316, 416). In some examples, the internal leadframe is acquired from a different manufacturer such that block 2302 is omitted. At block 2304, the method includes attaching a first die (e.g., the dies 112, 208, 304, 404) to the internal leadframe. The first die is attached in any suitable manner depending on the nature of the die and/or the design of the internal leadframe. For instance, the first die is (1) attached to a full die attach pad (e.g., the die attach pad 104 of FIG.

1), (2) attached to a half-etched die attach pad (e.g., the die attach pad 204 of FIG. 2), (3) attached directly to leads of the leadframe in a chip-on-lead configuration (e.g., the die 304 attached to the leads 306 of FIG. 3), (4) a flip chip attached via solder bumps (e.g., the die 404 attached via the solder bumps 406 of FIG. 4).

At block 2306, the method includes connecting wire bonds (e.g., the wire bonds 116, 212, 310) between the first die and the internal leadframe. In examples where the die is a flip chip, block 2306 is omitted. At block 2308, the method includes covering the first die and the associated wire bonds to form an internal leadframe package (e.g., the internal leadframe package 100, 200, 300, 400). At block 2310, the method includes cutting a groove into a casing (e.g., the casings 120, 218, 314, 414) of the internal leadframe package. This process enables the formatting of a notch (e.g., the notch 902) in the internal leadframe package. In some examples, block 2310 is omitted. At block 2312, the method includes singulating the internal leadframe package from other packages. In some examples, the singulation process of block 2312 uses a singulation saw with a width that is less than the width of the singulation saw used to cut the groove at block 2310. In this manner, a notch will remain in the internal leadframe package when the internal leadframe package is singulated. Block 2312 represents the completion of the internal leadframe package.

At block 2314, the method includes manufacturing an external leadframe (e.g., the external leadframe 504). In some examples, the external leadframe is made of copper and is plated with a plating metal (e.g., the plating metal 506). In some examples, the external leadframe is acquired from a different manufacturer such that block 2314 is omitted. At block 2316, the method includes applying laminate tape (e.g., the laminate tape 1700) to the external leadframe. In some examples, the laminate tape is applied to the surface (e.g., the underside) of the external leadframe that is to remain exposed to the external environment after completion of the manufacture of the multi-die package. Exposure of the underside of the external leadframe enables the leads of the leadframe to be mounted (e.g., via soldering) to a PCB.

At block 2318, the method includes attaching the internal leadframe package (completed at block 2312) to the laminate tape between leads of the external leadframe. In some examples, the internal leadframe package is attached with a bottom surface (e.g., the bottom surface 122, 222, 318, 418) of the internal leadframe package facing away from the laminate tape. That is, the internal leadframe of the internal leadframe package faces upward and away from the laminate tape to remain exposed for subsequent processing. At block 2320, the method includes attaching a second die (e.g., the die 508) to the internal leadframe package. More particularly, in some examples, the second die is attached to the bottom surface of the internal leadframe package that is facing away from the laminate tape. In this manner, the first and second dies are positioned on opposite sides of the internal leadframe.

At block 2322, the method includes connecting wire bonds (e.g., the wire bonds 512, 514) between the second die and both the internal and external leadframes. At block 2324, the method includes covering the second die and the associated wire bonds along with the internal leadframe package. That is, a molding compound (e.g., the molding compound 516) is conformally molded around the second die, the wire bonds, and the internal leadframe package down to the external leadframe and laminate tape. In some such examples, the molding compound will fill in the notch cut into the casing of the internal leadframe package resulting from blocks 2310 and 2312.

At block 2326, the method includes removing the laminate tape. At block 2328, the method includes singulating the final multi-die package from other IC packages. Thereafter, the example method of FIG. 23 ends.

Although an example method is described with reference to the flowchart illustrated in FIG. 23, many other methods of manufacturing the example multi-die packages 500, 600, 700, 800 of FIGS. 5-9 may alternatively be used in accordance with the teachings disclosed herein. For example, the order of execution of the blocks may be changed, and/or some of the blocks described may be changed, eliminated, or combined. Similarly, additional operations may be included in the manufacturing process before, in between, or after the blocks shown in the illustrated example.

Figure 24:
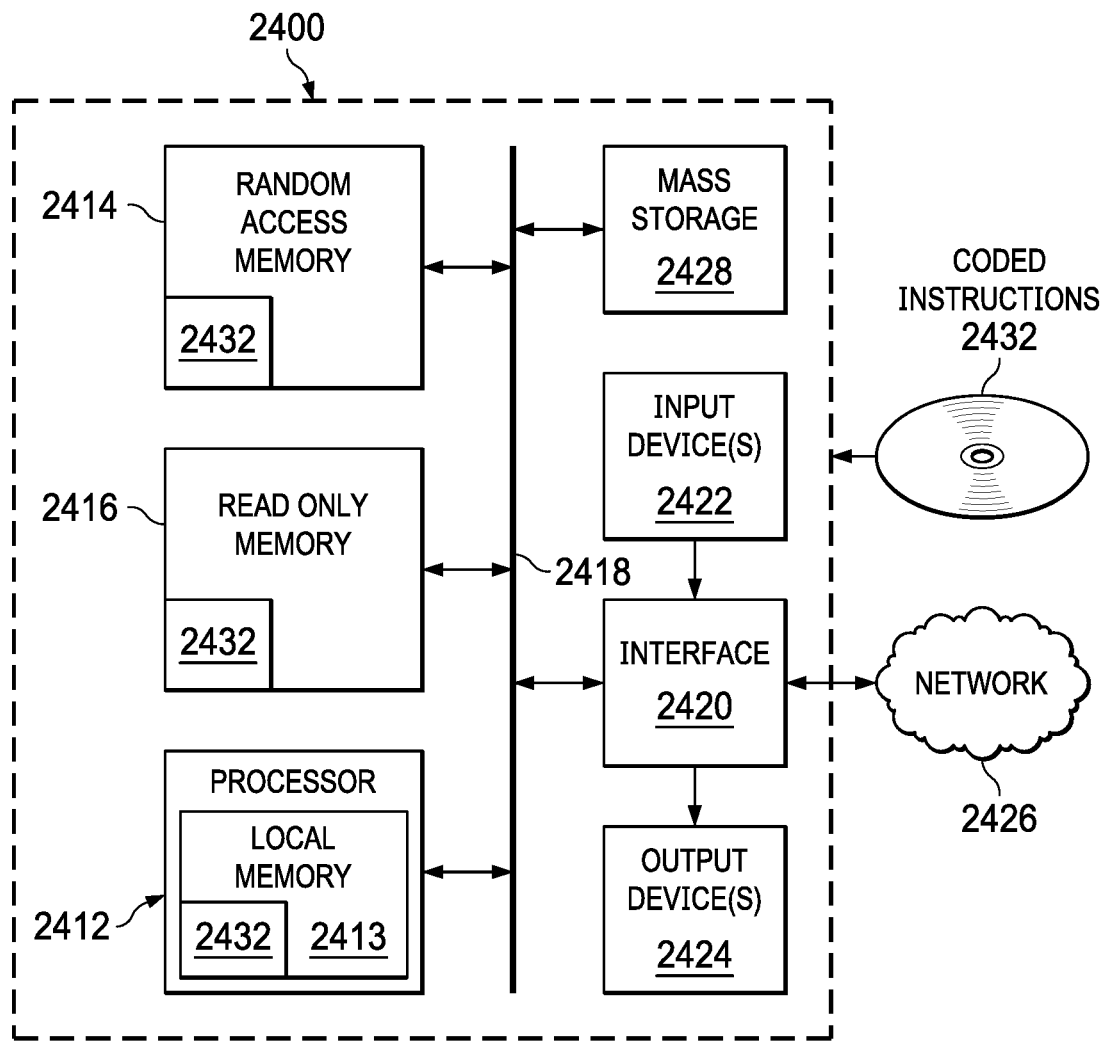
FIG. 24 is a block diagram of an example processor system associated with one or more IC packaging machines to execute example machine readable instructions represented at least in part by the example method of FIG. 23 to manufacture the example multi-die packages of FIGS. 5-9.

FIG. 24 is a block diagram of an example processor platform 2400 associated with one or more IC packaging machines to execute example machine readable instructions represented at least in part by the example methods of FIG. 23 to manufacture the multi-die packages of FIGS. 5-9. The processor platform 2400 can be any type of computing device.

The processor platform 2400 of the illustrated example includes a processor 2412. The processor 2412 of the illustrated example is hardware. For example, the processor 2412 can be implemented by one or more integrated circuits, logic circuits, microprocessors or controllers from any desired family or manufacturer. The hardware processor is a semiconductor based (e.g., silicon based) device.

The processor 2412 of the illustrated example includes a local memory 2413 (e.g., a cache). The processor 2412 of the illustrated example is in communication with a main memory including a volatile memory 2414 and a non-volatile memory 2416 via a bus 2418. The volatile memory 2414 is implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 2416 is implemented by flash memory and/or any other desired type of memory device. Access to the main memory 2414, 2416 is controlled by a memory controller.

The processor platform 2400 of the illustrated example also includes an interface circuit 2420. The interface circuit 2420 is implemented by any type of interface standard, such as an Ethernet interface, a universal serial bus (USB), and/or a PCI express interface.

In the illustrated example, one or more input devices 2422 are connected to the interface circuit 2420. The input device(s) 2422 permit(s) a user to enter data and/or commands into the processor 2412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 2424 are also connected to the interface circuit 2420 of the illustrated example. The output devices 2424 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 2420 of the illustrated example, thus, typically includes a graphics driver card, a graphics driver chip and/or a graphics driver processor.

The interface circuit 2420 of the illustrated example also includes a communication device such as a transmitter, a receiver, a transceiver, a modem and/or network interface card to facilitate exchange of data with external machines (e.g., computing devices of any kind) via a network 2426 (e.g., an Ethernet connection, a digital subscriber line (DSL), a telephone line, coaxial cable, a cellular telephone system, etc.).

The processor platform 2400 of the illustrated example also includes one or more mass storage devices 2428 for storing software and/or data. Examples of such mass storage devices 2428 include floppy disk drives, hard drive disks, compact disk drives, Blu-ray disk drives, RAID systems, and digital versatile disk (DVD) drives.

Coded instructions 2432 to implement the example method of FIG. 23 are stored in at least one of the mass storage device 2428, in the volatile memory 2414, in the non-volatile memory 2416, and/or on a removable tangible computer readable storage medium such as a CD or DVD.

From the foregoing, it will be appreciated that example methods, apparatus and articles of manufacture have been disclosed that enable the manufacture of multi-die IC packages where separate ones of the dies are positioned on opposite sides of a leadframe while the overall design of the package corresponds to a QFN structure in which leads do not protrude beyond the sides of the package housing and are exposed on an underside of the package. This is made possible by manufacturing the multi-die packages with an internal leadframe (that is positioned between two dies with no portion exposed to the external environment) and a separate external leadframe that is exposed to the external environment.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit package, comprising:
   a portion of a first leadframe;
   a first die on a first side of the first leadframe;
   a second die on a second side of the first leadframe opposite the first side; and
   a portion of a second leadframe, separate from the first leadframe, including external leads of the integrated circuit package, a section of the portion of the second leadframe exposed to an external environment along an outer surface of the integrated circuit package, the first die closer to the outer surface than the first leadframe, the first leadframe closer to the outer surface than the second die;
   a casing including a molding compound that covers portions of the first die, the casing being spaced apart from the second die and spaced apart from the second leadframe;
   wherein the second die is directly attached to the portion of the second leadframe and a portion of the molding compound via a die attach layer.

2. The integrated circuit package as defined in claim 1, wherein no portion of the first leadframe is exposed to the external environment of the integrated circuit package.

3. The integrated circuit package as defined in claim 1, wherein the molding compound is a first molding compound, the integrated circuit package further including a housing including a second molding compound, wherein portions of the external leads of the second leadframe are exposed to the external environment without protruding beyond sides of the housing.

4. The integrated circuit package as defined in claim 1, further including:
   a first wire bond electrically connecting the first die to the first leadframe;
   a second wire bond electrically connecting the second die to the first leadframe; and
   a third wire bond electrically connecting the second die to the second leadframe.

5. The integrated circuit package as defined in claim 1, wherein the molding compound is a first molding compound, the integrated circuit package further including a housing including a second molding compound that covers portions of the second die.

6. The integrated circuit package as defined in claim 5, wherein a material of the first molding compound is the same as that of the second molding compound.

7. The integrated circuit package as defined in claim 5, wherein the second die is attached to a surface of the casing, the second die spaced apart from the first leadframe.

8. The integrated circuit package as defined in claim 5, wherein the casing defines a notch, the second molding compound to fill the notch.

9. The integrated circuit package as defined in claim 5, wherein the second molding compound covers portions of the first leadframe and portions of the casing.

10. The integrated circuit package as defined in claim 1, wherein the first leadframe includes a die attach pad, at least one of the first die or the second die being attached to the die attach pad.

11. The integrated circuit package as defined in claim 10, wherein the die attach pad is a full die attach pad, both the first and second dies being attached to the die attach pad.

12. The integrated circuit package as defined in claim 10, wherein the die attach pad is a half-etched die attach pad, the first die being attached to the die attach pad, the second die being separated from the die attach pad by the molding compound of the casing.

13. The integrated circuit package as defined in claim 1, wherein the casing includes a first surface and a second surface opposite the first surface, the first surface facing in a same direction as the outer surface of the integrated circuit package, the second die directly attached to the second surface via the die attach layer.

14. The integrated circuit package as defined in claim 13, wherein the first surface of the casing corresponds to the outer surface of the integrated circuit package.

15. The integrated circuit package as defined in claim 13, wherein the casing includes a lateral surface transverse to the first and second surfaces, the casing defining a notch between the lateral surface and the second surface.

16. The integrated circuit package as defined in claim 1, wherein at least one of the first leadframe or the second leadframe include a core and a plating metal on an exterior of the core, the core including a different material than the plating metal.

* * * * *